United States Patent [19]

Lo

[11] Patent Number: 4,686,392

[45] Date of Patent: Aug. 11, 1987

[54] MULTI-FUNCTIONAL DIFFERENTIAL CASCODE VOLTAGE SWITCH LOGIC

[75] Inventor: Tin-Chee Lo, Fishkill, N.Y.

[73] Assignee: International Business Machines Corporation, Armonk, N.Y.

[21] Appl. No.: 792,933

[22] Filed: Oct. 30, 1985

[51] Int. Cl.$^4$ .................................. H03K 17/693
[52] U.S. Cl. ........................... 307/448; 307/445; 307/455; 307/468; 364/716
[58] Field of Search ............ 307/445, 448, 454, 455, 307/466–468, 254; 364/716

[56] References Cited

U.S. PATENT DOCUMENTS

| | | | |
|---|---|---|---|
| 3,446,989 | 5/1969 | Allen et al. | 307/454 |
| 3,906,212 | 9/1975 | Poguntke | 307/467 X |
| 3,925,684 | 12/1975 | GasKill, Jr. et al. | 307/455 |
| 3,925,691 | 12/1975 | GasKill, Jr. et al. | 307/300 |
| 3,982,138 | 9/1976 | Luisi et al. | 307/451 |
| 4,140,924 | 2/1979 | Oguey et al. | 307/279 X |
| 4,349,750 | 9/1982 | Geurts | 307/455 X |
| 4,513,283 | 4/1985 | Leininger | 307/455 X |
| 4,608,649 | 8/1986 | Davis et al. | 307/468 X |

FOREIGN PATENT DOCUMENTS

| | | |
|---|---|---|
| 2827067 | 1/1979 | Fed. Rep. of Germany . |
| 831266 | 3/1960 | United Kingdom ............... 307/455 |

OTHER PUBLICATIONS

Davis et al., "Sixteen-Input Funnel Utilizing Five-Level Differential Cascode Current Switch"; IBM-TDB; vol. 26, No. 7A, pp. 3515, 12/1983.

"Single-Ended Pseudo-Clocked Cascode Voltage Switch Logic"; IBM-TDB, vol. 27, No. 11, pp. 6529-6530; 4/1985.

Underwood, IBM Technical Disclosure Bulletin, vol. 21, 1979, pp. 4808-4810, "Cascode Current Switch ALU".

Hiltebeitel IBM Technical Disclosure Bulletin, vol. 24, 1982, pp. 5470-5471, "CMOS XOR".

Carter, IBM Technical Disclosure Bulletin, vol. 24, 1981, pp. 1705-1706.

*Primary Examiner*—Stanley D. Miller
*Assistant Examiner*—D. R. Hudspeth
*Attorney, Agent, or Firm*—Sughrue, Mion, Zinn, Macpeak & Seas

[57] ABSTRACT

A differential cascode voltage switch (DCVS) logic circuit in which different DCVS logic blocks are connected in parallel to the output lines. Selection transistors connected to each logic block complete the conductivity path to ground. Only one selection transistor is selected at a time to thereby select the associated logic blocks. The circuit can be improved by merging portions of the different logic blocks which are identically connected to the output lines.

1 Claim, 6 Drawing Figures

MULTI-FUNCTIONAL DIFFERENTIAL CASCODE VOLTAGE SWITCH LOGIC

BACKGROUND

1. Field of the Invention

This invention relates generally to logic circuits. In particularly, the invention relates to a method for reducing the transistor count in differential cascode voltage switch logic.

2. Background Art

A logic technology that has been gaining widespread acceptance is differential cascode voltage switch (DCVS) logic. Single-ended cascode voltage switches have been described by Hiltebeitel in a technical article "CMOS XOR" in the IBM Technical Disclosure Bulletin, Vol. 24, No. 11A, April 1982 at pages 5470 and 5471. Double-ended or differential cascode voltage switch logic will be described in more detail here but has previously been described by Carter, et at. in a technical article entitled "Cascode Parity Circuit", appearing in the IBM Technical Disclosure Bulletin, Vol. 24, number 3, August 1981 at pages 1705 and 1706.

The principles of operation of DCVS will be briefly described with reference to FIG. 1. In DCVS, two loads 10 and 12 are connected to a power supply line 13 at a fixed positive voltage $V_H$ and the other ends of the loads 10 and 12 are respectively connected to a complemented output line 14 and a true output line 16. Typically, the loads 10 and 12 are PMOS transistors having their gates cross-coupled to the drains of the other transistors. However, resistive or depletion NMOS loads are also used. A complemented output signal $\overline{V}_{OUT}$ on the complemented output line 14 is the complement of a true output signal $V_{OUT}$ on the true output line 16. The true and complemented output lines 16 and 14 are connected through a logic block 18 to ground. Internal to the logic block 18 is a tree-like structure of field-effect transistors (FETs), which are controlled by one or more pairs of true and complemented input signals $V_1, \overline{V}_1 \ldots V_N, \overline{V}_N$. The FETs are usually of the NMOS type with the PMOS load devices just described. The logic tree is arranged such that any combination of the controlling signals produces one and only one conduction path through the logic block 18. This conduction path connects either the true output line 16 or the complemented output line 14 to ground. The output line 14 or 16 having a conduction path through the logic 18 to ground is at the ground potential while the other output line 16 or 14 is at the power supply voltage $V_H$.

It is typical that there be multiple stages of the DCVS circuit of FIG. 1 such that the outputs of one stage provide at least a portion of the input signals of following stages. Such a combination of cascode voltage switches has been described by Krambeck et al. in a technical article entitled "High-Speed Compact Circuits with CMOS", appearing in IEEE Journal of Solid-State Circuits, Vol. SC-17, number 3, June 1982 at pages 614–619.

An example of a transistor tree in the logic 18 is presented in FIG. 2 and consists of three types of transistor groups 20, 22 and 24. The internal structures of the logic blocks 18, 40 and 42 (FIG. 4) are by way of example only and other structures are, of course, possible. Each transistor group is, in actuality, of the same form as shown in FIG. 3 for transistor group 20. The transistor group 20 consist of two NMOS FETs 26 and 28 with their sources commonly connected to a source terminal 30 but having separate drain terminals 32 and 34. The gate electrodes 36 and 38 of the transistors 26 and 28 respectively are controlled by complementary input signals $V_1$ and $\overline{V}_1$. Because of the complementary nature of the input signals, only one of the transistors 26 or 28 is conducting at any time. That is, depending upon the value of the input signal $V_1$, either the drain terminal 32 or the drain terminal 3 has a high conductivity path through the transistor group 20 to the source terminal 30.

Based upon this understanding of the internal operations of the transistor groups 20, 22 and 24, they are arranged and interconnected in the logic 18 so as to provide only a single conduction path from either of the output lines 14 or 16 to ground. That is, only output line 14 or only output line 16 is grounded. In a rigorous DCVS design, such as that illustrated in FIG. 2, this condition can be obtained by connecting each of the drain terminals 32 and 34 to only one source terminal 30 of another transistor group or alternatively to one of the output lines 14 or 16 and by connecting each source terminal 30 to only one drain terminal 32 or 34 or alternatively to ground. However, it is common practice to violate a strict tree structure as long as the condition of a single conductivity path is not violated for any combination of input signals.

Although the DCVS circuit of FIGS. 1 and 2 provides many advantages, there is room for improvement. The loads 10 and 12 take up a larger percentage of chip area when the associated logic block 18 is relatively simple. Only a single logic function has been represented in FIG. 2. It is fairly typical in the design of DCVS to rely upon fairly simple logic blocks 18 but to include several of them within the complete circuit. Significant portions of different logic blocks 18 may be similar but as long as each one has some difference, it is necessary to replicate both the loads as well as the repeating transistor groups. Obviously, this replication requires valuable chip area.

SUMMARY OF THE INVENTION

Accordingly, it is an object of this invention to provide a DCVS integrated circuit that minimizes the chip area requirements.

It is a further object of this invention to provide a DCVS integrated circuit that avoids the replication of circuit elements.

The invention can be summarized as a DCVS integrated circuit in which multiple logic blocks are connected to the same output nodes and the same loads. Each logic block is connected to ground through a selection transistor. Only one of the selection transistors is turned on at any one time, thus selecting the associated logic block.

In a further improvement, the nodes of a transistor trees composed of the transistors of the multiple logic blocks are compared. If any two voltage nodes have identically functional connections to the output lines, the nodes are combined and only one of the identical connecting limbs is retained.

DETAILED DESCRIPTION OF THE PREFERRED EMBODIMENTS

Figure 4:
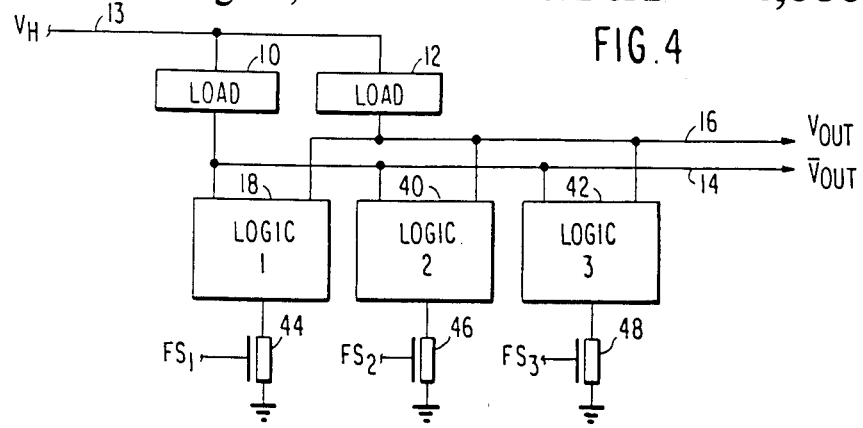
FIGS. 4 and 5 are block diagrams of the multiple logic blocks of the invention.

According to the invention, multiple logic blocks 18, 40 and 42, as shown in FIG. 4, are connected to a single set of loads 10 and 12 and of output lines 14 and 16. It is, of course, assumed that the different logic blocks 18, 40 and 42 represent different logic functions. Each of the logic blocks 18, 40 and 42 is separated from ground by a respective selection transistor 44, 46 or 48 of the NMOS type. The gates of the respective selection transistors 44, 46 and 48 are controlled by respective selection signals $FS_1$, $FS_2$ and $FS_3$. Only one of the selection signals $FS_1$, $FS_2$ or $FS_3$ is true (high) at any one time. If there are only three logic blocks 18, 40 and 42, as shown in FIG. 4, then one and only one of the selection signals $FS_1$, $FS_2$ or $FS_3$ is true when the DCVS circuit of FIG. 4 is expected to produce a valid pair of complementary output signals $V_{OUT}$ and $\overline{V}_{OUT}$ on the output lines 16 and 14. These conditions on the selection signals differ from the situation where the selection transistors 44, 46 and 48 would be included within the logic function.

Figure 3:
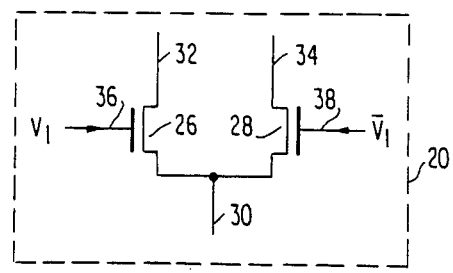
FIG. 3 is a gate level representation of a transistor group of FIG. 2.

In operation, the selection signals $FS_1$–$FS_3$ select which of the logic blocks 18, 40 or 42 is to be evaluated with the resultant signals being produced on the output lines 14 and 16. The selection signals $FS_1$–$FS_3$ can be either inputs to the integrated circuit or can be one of the output signals $V_{OUT}$ or $\overline{V}_{OUT}$ from another DCVS circuit. Of course, if all of the selection signals $FS_1$–$FS_3$ are derived from other DCVS circuits, those circuits must be of a functional form such that only one of the signal $FS_1$–$FS_3$ is true at any time. This use of only one of the true and complementary output signals differs from a conventional DCVS design. It should be noted that the case of two logic blocks has been excluded from the example because two selection signals $FS_1$ and $FS_2$ can be complementary so that the two associated selection transistors 44 and 46 would conform to the requirements of a transistor group of FIG. 3. Such is not the case when there are three or more logic blocks to be individually selected.

Figure 1:
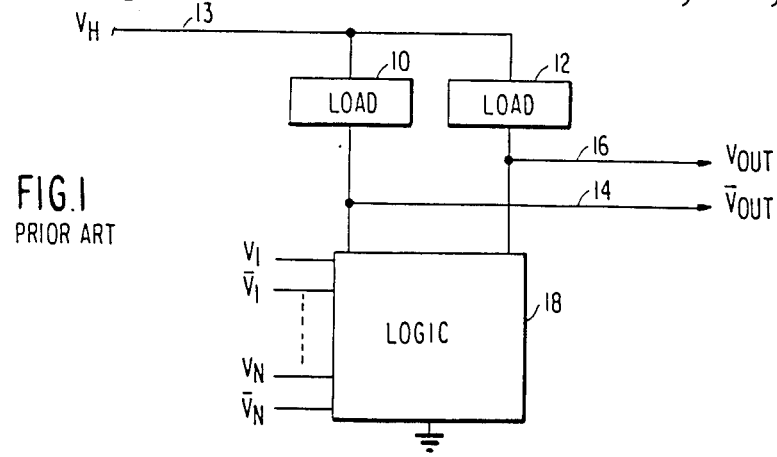
FIGS. 1 and 2 are block diagrams of a DCVS circuit of the prior art.
Figure 2:
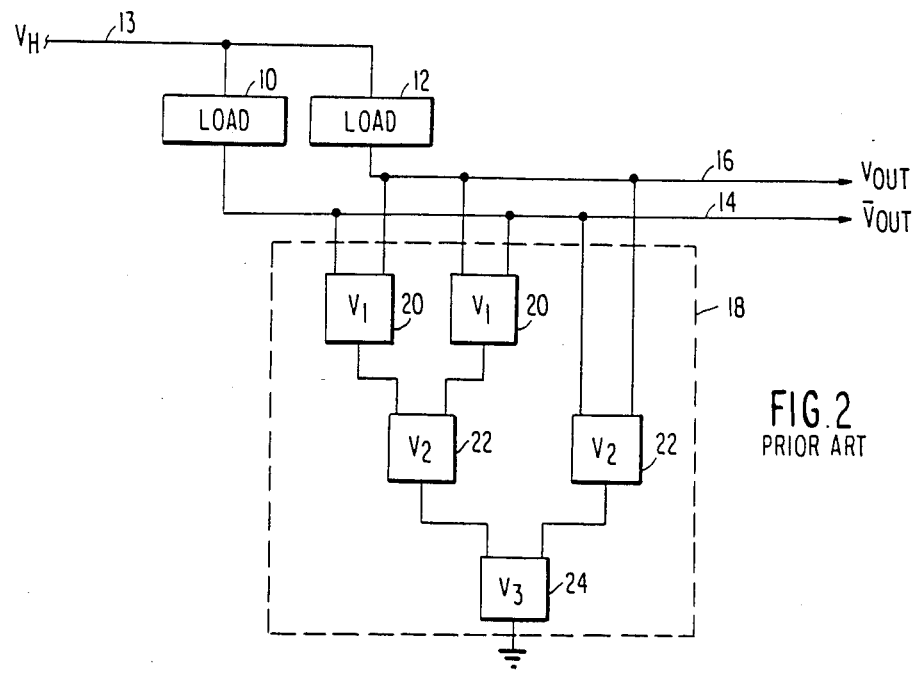
Figure 5:
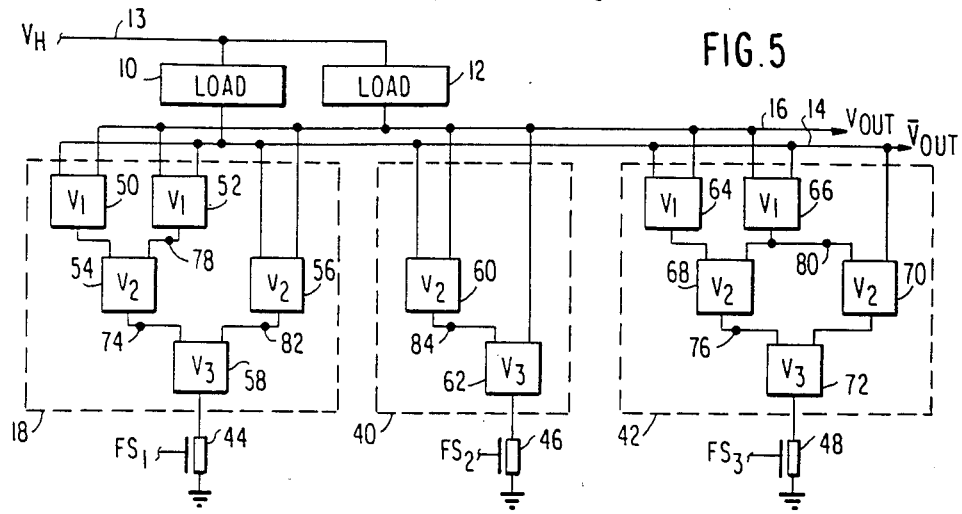

An example of the configuration of the logic blocks of FIG. 4 is given in FIG. 5. The logic block 18 is identical to that presented in FIG. 2, with the exception of the numbering of the transistor groups 50–58. The logic blocks 40 and 42 are composed of, for example, transistor groups 60–72. It should be noted that the logic block 42 does not conform to the strict definition of a DCVS transistor tree. The DCVS circuit of FIG. 5 has the advantage of using only a single pair of loads 10 and 12 for the three logic blocks 18, 40 and 42, thus saving the area for four loads. However, the circuit does require three additional selection transistors 44, 46 and 48 over the standard configuration of the prior art. The real savings is in the power of the DCVS circuit of FIG. 5 since only one conduction path through all three logic blocks 18, 40 and 42 can be established at any one time for a power saving of a factor of three.

The DCVS circuit of FIG. 5 can be further improved by recognizing that in the collection of relatively simple logic blocks, there are several voltage nodes that see the same possible conduction paths to the output lines 14 and 16. Such voltage nodes can be connected and the identically connected transistor groups can be merged.

Figure 6:
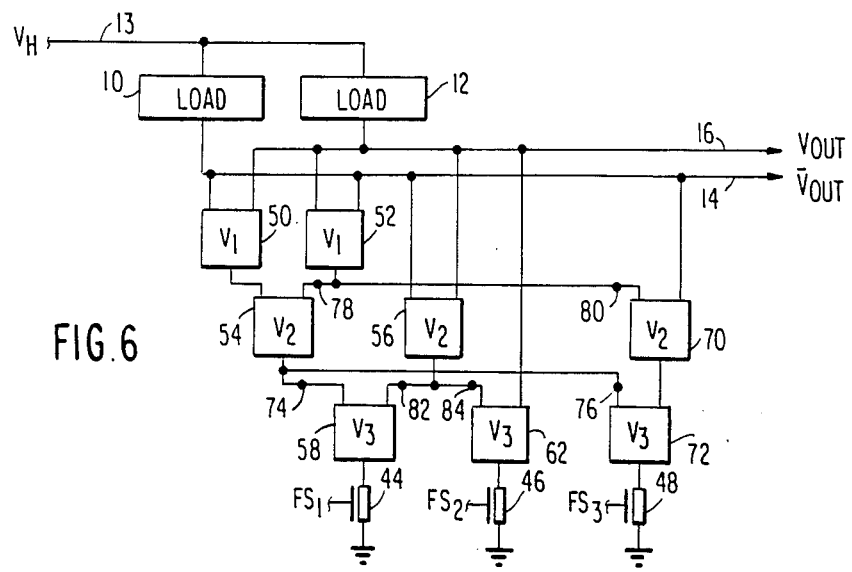
FIG. 6 is a block diagram of a DCVS circuit that results from merging the logic blocks of FIG. 5.

This merging is illustrated in FIG. 6 with reference to FIG. 5. Voltage nodes 74 and 76 see the same connections and transistor groups to the output lines 14 and 16. Namely, the voltage node 74 sees the transistor groups 50–54 while the voltage node 76 sees functionally identical transistor groups 64–68 with functionally identical connections. As a result, voltage node 76 can be merged with voltage node 74 and the transistor groups 64 and 68 can be eliminated. It should be noted that transistor group 66 cannot be eliminated at this point because it has a further connection on the lower side to transistor group 70. However, voltage node 78 sees the same functional connections to the output lines 14 and 16 as the voltage node 80. These two voltage nodes 78 and 80 can be merged with the elimination of the transistor group 66. In the same way, voltage nodes 82 and 84 can be merged with the elimination of transistor group 60. The resultant structure for the DCVS circuit of FIG. 6 has eliminated the 4 transistor groups 60, 64, 66 and 68 of the 12 transistor groups 50–72 of FIG. 5, for a net saving of 8 transistors. Such a savings is significant, even though it results in a non-rigorous DCVS tree.

Although it may be possible to provide an efficient algorithm for determining which voltage nodes should be merged, at this time, the inventor has only performed this analysis by hand. A first step at automating the merger process would be to compare each voltage node between transistor groups with all other such nodes to determine if the connections to the two output lines are identical.

A single ended cascode voltage switch circuit does not produce complementary output signals for two output lines 14 and 16. For example, the DCVS circuit of FIG. 5 can be converted to a single ended logic circuit by eliminating the true output lines 16 and its associated load 12. Then, transistors within the transistor groups 50–72 of FIG. 5 are eliminated for a single-ended circuit if they only provide a conduction path to the eliminated true output line 16. This would allow the elimination of 7 transistors in the logic groups 50, 52, 56, 60, 62, 64 and 66. At least the first stage of the invention is applicable to single-ended cascode voltage switch logic.

The merger process, however, presents a closer choice since the merged DCVS logic is considered to be quite compact. Changing the merged differential logic of FIG. 6 to a single-ended logic would enable the elimination of four transistors from transistor groups 50, 52, 56 and 62. The merged single-ended circuit is more compact than the unmerged single-ended circuit. But the merged DCVS circuit is only marginally more complex than the merged single-ended circuit. The single-ended circuit has the disadvantage that it provides only a single output signal $\overline{V}_{OUT}$ and it is fairly common that an intermediate signal must be used in two or more following logic blocks in both a true and complementary form. Thus, it would then be necessary to provide an additional inverter for the single-ended circuit. Thus, the merger process is more productive with a DCVS circuit than it is with a single-ended circuit.

I claim:

1. A method of designing a logic circuit, comprising the steps of:
   providing at least three logic blocks, each logic block comprising a plurality of connected transistors controlled by input logic signals to selectively provide one and only one conductivity path between a selection node and the combination of two block output nodes;

connecting two loads between a first predetermined reference potential and two logic signal output nodes;

connecting said block output nodes to said logic signal output nodes, said logic signal output nodes providing complementary signals;

connecting at least three selection transistors between respective selection nodes and a second predetermined reference potential, said selection transistors providing selection of one of said logic blocks;

identifying at least two voltage nodes in at least two separate ones of said logic blocks having functionally equivalent sets of connections to said logic signal output nodes;

connecting said identical voltage nodes; and eliminating transistors in a path from all but one of said identical voltage nodes to said logic signal output nodes.

* * * * *